United States Patent
Naylor

(10) Patent No.: US 12,354,957 B2
(45) Date of Patent: Jul. 8, 2025

(54) INTERCONNECT STRUCTURES WITH DIFFERENT METAL MATERIALS

(71) Applicant: Intel Corporation, Santa Clara, CA (US)

(72) Inventor: Carl H. Naylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 796 days.

(21) Appl. No.: 17/463,692

(22) Filed: Sep. 1, 2021

(65) Prior Publication Data
US 2023/0069567 A1 Mar. 2, 2023

(51) Int. Cl.
H01L 23/532 (2006.01)
H01L 21/768 (2006.01)
H01L 23/522 (2006.01)

(52) U.S. Cl.
CPC .. *H01L 23/53238* (2013.01); *H01L 21/76849* (2013.01); *H01L 21/76856* (2013.01); *H01L 23/53209* (2013.01); *H01L 23/53266* (2013.01); *H01L 23/5226* (2013.01)

(58) Field of Classification Search
CPC ......... H01L 21/76843; H01L 21/76849; H01L 23/5226; H01L 23/53238; H01L 23/53209; H01L 23/53266
See application file for complete search history.

(56) References Cited

U.S. PATENT DOCUMENTS

| 6,358,848 B1* | 3/2002 | Lopatin | H01L 21/76862 |
| | | | 438/622 |
| 7,338,908 B1* | 3/2008 | Koos | H01L 21/76849 |
| | | | 257/E21.309 |
| 2013/0127055 A1* | 5/2013 | Chen | H01L 21/76819 |
| | | | 438/653 |
| 2014/0264920 A1* | 9/2014 | Yang | H01L 21/32134 |
| | | | 438/658 |

(Continued)

FOREIGN PATENT DOCUMENTS

EP 1744358 A1 1/2007

OTHER PUBLICATIONS

Extended European Search Report received for EP Application No. 22183807.1, dated Jan. 11, 2023. 8 pages.

*Primary Examiner* — Jaehwan Oh
(74) *Attorney, Agent, or Firm* — Finch & Maloney PLLC

(57) ABSTRACT

Techniques are provided herein for forming interconnect structures, such as conductive vias or contacts, that are protected from subsequent processing that includes reactive gas or plasma. A conductive via or contact within an interconnect layer may be formed with a capping layer having a different material to protect the underlying metal material from reacting with certain reactive gas or plasma elements. In some examples, a ruthenium capping layer is formed over a copper via to protect the copper. Other capping layer materials may include tungsten, cobalt, or molybdenum. In some embodiments, the entire conductive via may be formed using one of ruthenium, tungsten, cobalt, (Continued)

or molybdenum, to avoid the use of more reactive metals, such as copper. The capping layer (or less reactive metals) are used to protect the via during a barrier layer doping process that uses a gas or plasma including a chalcogen element (e.g., sulfur and/or selenium).

20 Claims, 8 Drawing Sheets

(56) References Cited

U.S. PATENT DOCUMENTS

| | | | |
|---|---|---|---|
| 2015/0228585 A1* | 8/2015 | He | H01L 21/76843 438/643 |
| 2021/0098376 A1* | 4/2021 | Lin | H01L 21/76805 |

* cited by examiner

INTERCONNECT STRUCTURES WITH DIFFERENT METAL MATERIALS

FIELD OF THE DISCLOSURE

The present disclosure relates to integrated circuits, and more particularly, to interconnect structures with different metal materials.

BACKGROUND

As integrated circuits continue to scale downward in size, a number of challenges arise. For instance, reducing the layer thickness is becoming increasingly more difficult. As transistor area decreases, so too do the dimensions for interconnects made to the various transistor structures, such as gate structures, drain regions, and source regions. For instance, interconnect structures utilize a barrier layer of tantalum nitride between the interconnect metal and the surrounding dielectric material to reduce or eliminate the diffusion of metal atoms or ions from the interconnect metal into the surrounding dielectric material or into any adjacent semiconductor materials. These tantalum nitride barrier layers must have a certain thickness to provide adequate barrier performance. As such, merely using thinner tantalum nitride or other standard barrier layers is not a workable solution.

Figure 1:
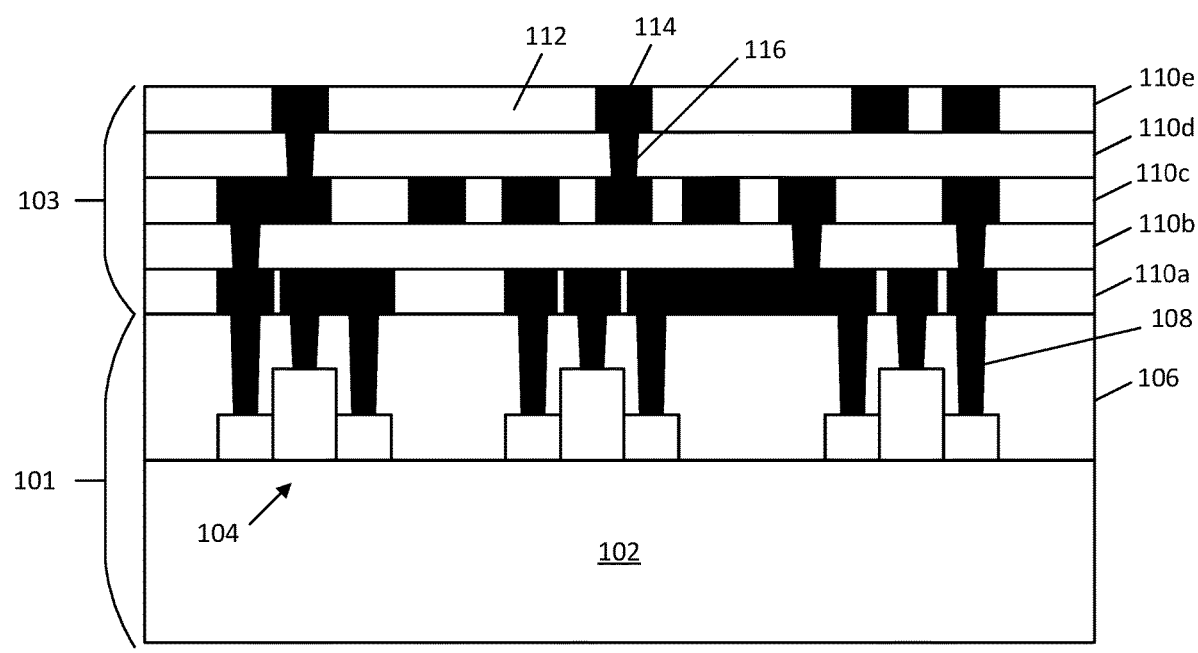
FIG. 1 is a cross-sectional view that illustrates an example portion of an integrated circuit configured with an interconnect region over a plurality of semiconductor devices, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Techniques are provided herein for forming interconnect structures, such as conductive vias or contacts, that are protected from subsequent processing that includes reactive gas or plasma species. Although the techniques can be used in any number of integrated circuit applications, they are particularly useful with respect to contacting schemes for size-constrained transistors such as those used in logic and memory cells, such as those cells that use finFETs, gate-all-around transistors, or other transistor technologies. According to some embodiments, a conductive via or contact within an interconnect layer is formed with a capping layer having a different material to protect the underlying metal material from reacting with certain reactive gas or plasma elements later in the process. In some examples, a ruthenium (Ru) capping layer is formed over a copper via to protect the copper (Cu). Other capping layer materials may include, for instance, tungsten (W), cobalt (Co), or molybdenum (Mo). In some embodiments, the entire conductive via may be formed using one of Ru, W, Co, or Mo, to avoid the use of more reactive metals, such as copper. According to some embodiments, the capping layer (or less reactive metals) are used to protect the interconnect structure during a barrier layer doping process that uses a reactive gas or plasma including sulfur or selenium. If copper is exposed to the sulfur or selenium, it can extrude outwards and damage or otherwise render inoperable the interconnect structure.

General Overview

As previously noted above, merely scaling standard barrier layers to smaller and smaller thicknesses is not a workable solution, given the competing need to also maintain barrier performance. To this end, there remain a number of non-trivial challenges with respect to forming relatively thin barrier layers while also maintaining barrier performance. In more detail, scaling interconnect structures may include thinner barrier layers to maximize the amount of conductive interconnect metal used in the various conductive features and traces. Barrier layers of tantalum nitride become ineffective if they are too thin (e.g., below about 2 nm), such that ions of the metal interconnect can migrate through the overly thin barrier and into neighboring dielectric and semiconductor materials. However, according to an embodiment of the present disclosure, tantalum can be mixed with other elements and doped using a chalcogen, such as sulfur or selenium, to strengthen the barrier properties of the tantalum-containing layer. This allows for a relatively thin (e.g., around 2 nm or around 1 nm) tantalum-based barriers to be used that are doped with sulfur or selenium. However, the sulfur or selenium may adversely react with copper and can cause the copper to extrude outward causing structural damage and/or reducing the conductivity of the interconnect.

Thus, and in accordance with a further embodiment of the present disclosure, techniques are provided herein to protect copper interconnect structures from any reactive gas elements (such as the aforementioned sulfur or selenium) during the fabrication process of the interconnect. As noted above, the reactive gases may be used to strengthen relatively thin barrier layers so they provide better barrier protection. According to some embodiments, a capping layer of another metal material may be used over any exposed copper features to protect the underlying copper from any reactive gas or plasma elements. In an example, the capping layer includes ruthenium, although other metals such as tungsten, cobalt, or molybdenum can also be used. In some embodiments, copper vias are replaced with conductive vias that instead use ruthenium, tungsten, cobalt, or molybdenum. According to some embodiments, the capping layer is thick enough such that the sulfur or selenium elements do not diffuse through its thickness. In some such embodiments, the thickness of the capping layer is between about 0.5 nm and about 2 nm.

According to an embodiment, an integrated circuit includes a plurality of semiconductor devices, an interconnect region above the plurality of semiconductor devices and having a first interconnect layer and a second interconnect layer over the first interconnect layer. The first interconnect layer includes a first dielectric layer and a conductive via through the first dielectric layer. The conductive via includes a first conductive layer. The second interconnect layer includes a second dielectric layer, a second conductive layer at least partially within the second dielectric layer, and a third conductive layer between the second conductive layer and the second dielectric layer. The third conductive layer includes oxygen and one or both of sulfur and selenium.

According to another embodiment, an integrated circuit includes a device layer including a plurality of semiconductor devices, a first interconnect layer above the device layer, and a second interconnect layer over the first interconnect layer. The first interconnect layer includes a first dielectric layer and a conductive via through the first dielectric layer. The conductive via includes a first conductive layer that comprises ruthenium. The second interconnect layer includes a second dielectric layer, a second conductive layer at least partially within the second dielectric layer, and a third conductive layer between the second conductive layer and the second dielectric layer.

According to another embodiment, a method of forming an integrated circuit includes forming a first interconnect layer above a plurality of semiconductor devices and forming a second interconnect layer over the first interconnect layer. Forming the first interconnect layer includes forming a first dielectric layer, forming a via through the first dielectric layer, forming a first conductive layer in the via, and forming a second conductive layer in the via over the first conductive layer. Forming the second interconnect layer includes forming a second dielectric layer, forming a cavity in the second dielectric layer over the via, forming a third conductive layer on one or more sidewalls of the cavity, the third conductive layer comprising oxygen, exposing the third conductive layer to a gas comprising sulfur or selenium to dope the third conductive layer with either sulfur or selenium, and forming a fourth conductive layer in the cavity The techniques can be used with any type of planar and non-planar transistors, including finFETs (sometimes called double-gate transistors, or tri-gate transistors), nanowire and nanoribbon transistors (sometimes called gate-all-around transistors), and thin film transistors, to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a remove metal gate, or RMG, process). Any number of semiconductor materials can be used in forming the transistors to which power is being supplied by a buried or backside power rail, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate conductive vias or contacts that include metals such as Ru, W, Co, or Mo. In some embodiments, one or more conductive vias or contacts includes a multilayer structure having both a Cu layer and a capping layer of Ru, W, Co, or Mo. Such tools may also indicate the presence of a thin barrier layer around the interconnect metal, where the barrier layer includes sulfur, selenium, or both. Numerous configurations and variations will be apparent in light of this disclosure.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Architecture

FIG. 1 is a cross-sectional view that illustrates an example portion of an integrated circuit having an interconnect region above a plurality of semiconductor devices, in accordance with an embodiment of the present disclosure. The semiconductor devices in this example are non-planar metal oxide semiconductor (MOS) transistors, such as tri-gate or gate-all-around (GAA) transistors, although other transistor topologies and types can also benefit from the techniques provided herein, as will be appreciated (e.g., planar transistors, thin film transistors, or any other transistors to which contact can be made).

According to some embodiments, the integrated circuit includes a device region 101, and an interconnect region 103 over the device region 101. Device region 101 may include a plurality of semiconductor devices 104 along with one or more other layers or structures associated with the semiconductor devices 104. For example, device region 101 can also include a substrate 102 and one or more dielectric layers 106 that surround active portions of the semiconductor devices 104. Device region 101 may also include one or more conductive contacts 108 that provide electrical contact to transistor elements such as gate structures, drain regions, or source regions. Conductive contacts 108 include tungsten, although other metal or metal alloy materials are possible.

Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, the substrate can be a semiconductor-on-insulator substrate having a desired semiconductor layer over a buried insulator layer (e.g., silicon over silicon dioxide). Alternatively, the substrate can be a multilayer substrate or superlattice suitable for forming nanowires or nanoribbons (e.g., alternating layers of silicon and SiGe, or alternating layers indium gallium arsenide and indium phosphide). Any number of substrates can be used. In some embodiments, backside processing is used to remove substrate 102 and form additional backside interconnect layers.

Interconnect region 103 includes a plurality of interconnect layers 110a-110e stacked over one another. Each interconnect layer can include a dielectric material 112 along with one or more different conductive features. Dielectric material 112 can be any dielectric, such as silicon oxide, silicon oxycarbide, silicon nitride, or silicon oxynitride. Dielectric material 112 may be formed using any known dielectric deposition technique such as chemical vapor deposition (CVD), plasma-enhanced chemical vapor deposition (PECVD), flowable CVD, spin-on dielectric, or atomic layer deposition (ALD). The one or more conductive features can include conductive traces 114 and conductive vias 116 arranged in any pattern across the interconnect layers 110a-110e to carry signal and/or power voltages to/from the various semiconductor devices 104. As used herein, conducive vias, such as conductive via 116, extend through an interconnect layer to connect between conductive traces on an upper interconnect layer and a lower interconnect layer, while conductive contacts, such as conductive contact 108, extend through a portion of dielectric layer 106 to contact one or more transistor elements. Although interconnect region 103 is illustrated with only five interconnect layers, any number of interconnect layers can be used within interconnect region 103.

Any of conductive traces 114 and conductive vias 116 can include any number of conductive materials, with some examples including copper, ruthenium, tungsten, cobalt, molybdenum, and alloys thereof. In some cases, any of conductive traces 114 and conductive vias 116 include a relatively thin liner or barrier, such as titanium nitride, titanium silicide, tungsten carbo-nitride (WCN), PVD or ALD tungsten, or tantalum nitride. As will be discussed in more detail herein, tantalum-based barriers may include dopants such as sulfur or selenium to strengthen their barrier properties and have a thickness below 2 nm or below 1 nm. Furthermore, conductive vias 116 may include a multilayer structure having both a copper layer and a layer of either ruthenium, tungsten, cobalt, or molybdenum.

It should be noted that each of the various conductive vias 116 and conductive contacts 108 are shown with tapered profiles to indicate a more natural appearance due to the etching process used to form the openings. Any degree of tapering may be observed depending on the etch parameters used and the thickness of the dielectric layer being etched through. Furthermore, conductive vias may be stacked one over the other through different dielectric layers of interconnect region 103. However, in some examples, a single via recess may be formed through more than one dielectric layer yielding a taller, more tapered conductive via that extends through two or more dielectric layers.

Figure 2A:
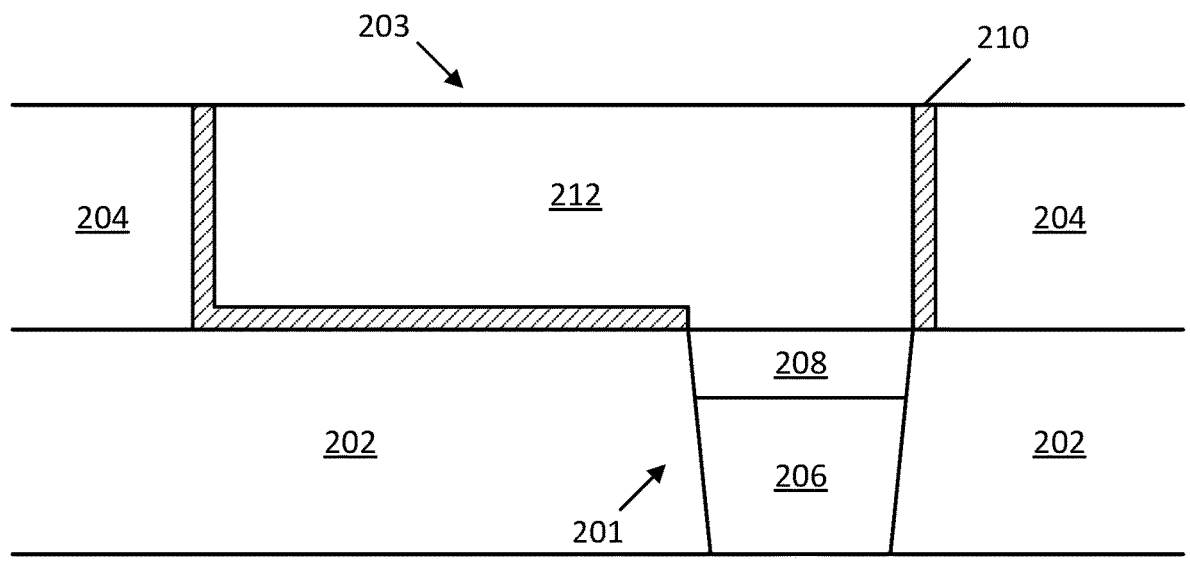
FIG. 2A is a cross-sectional view that illustrates an interconnect having a capping material to protect an underlying conductive via, in accordance with an embodiment of the present disclosure.

FIG. 2A illustrates a more detailed cross-section view of two interconnect layers of the integrated circuit from FIG. 1, according to an embodiment. A first interconnect layer may include a conductive via 201 that extends through a dielectric layer 202. As noted above, dielectric layer 202 may be any dielectric, such as silicon oxide, silicon oxycarbide, silicon nitride, or silicon oxynitride. A second interconnect layer over the first interconnect layer includes a conductive trace 203 that is set within another dielectric layer 204 that may include the same material as dielectric layer 202.

Conductive via 201 may include a multi-layer structure having at least a first conductive layer 206 and a second conductive layer 208 over the first conductive layer 206. First conducive layer 206 may include copper that is protected from one or more reactive processes used to form a barrier layer 210 by second conductive layer 208. Accordingly, second conductive layer 208 acts like a capping layer over first conducive layer 206. According to an embodiment, second conductive layer 208 includes ruthenium. In some other embodiments, second conductive layer includes tungsten, cobalt, or molybdenum. In yet other embodiments, second conductive layer 208 represents a multi-layer structure having layers of any two or more of ruthenium, tungsten, cobalt, or molybdenum. In some embodiments, second conductive layer 208 has a thickness between about 0.5 nm and about 2 nm, while conductive via 201 has a total thickness between about 15 nm and about 30 nm.

In some embodiments, conductive trace 203 includes a third conductive layer 212 and barrier layer 210 around side and bottom surfaces of third conductive layer 212. Barrier layer 210 may also be considered to be present along sidewalls of dielectric layer 204 and/or along a portion of the top surface of dielectric layer 202, rather than being part of conductive trace 203. More particularly, barrier layer 210 forms a barrier between third conductive layer 212 and any of dielectric layers 202 and 204. In some examples, barrier layer 210 is also present along a top surface of second conductive layer 208. In some examples, barrier layer 210 is also present along the sides of conductive via 201 (e.g., between dielectric layer 202 and conductive layers 206 and 208). The portion of barrier layer 210 present along the sides of conductive via 201 may not include any dopants.

Third conductive layer 212 may include copper or any other sufficiently conductive metal material. Barrier layer 210 may include tantalum, nitrogen, and oxygen (TaNO) doped with either sulfur or selenium (e.g., TaNOS or TaNOSe). In some embodiments, barrier layer 210 is doped with between 2-5% sulfur or selenium by weight. The doping with either sulfur or selenium strengthens the barrier properties of barrier layer 210 and allows for it to function as a barrier even at relatively low thicknesses. In some examples, barrier layer 210 is less than 2 nm thick, or less than 1.5 nm thick, or less than 1 nm thick (e.g., 0.5 to 2 nm, such as about 1 nm thick).

Figure 2B:
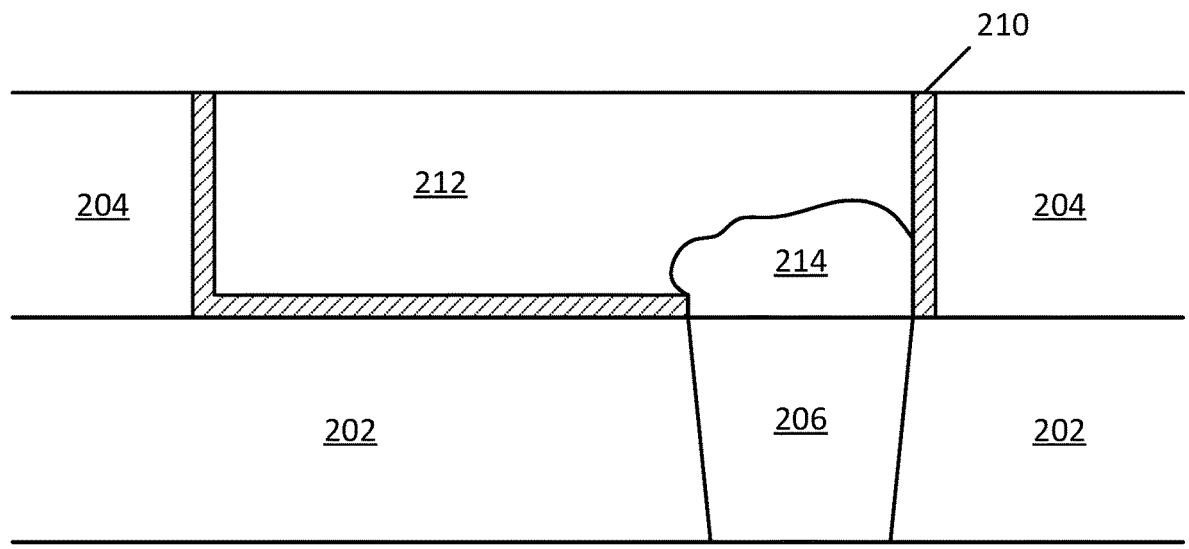
FIG. 2B is a cross-sectional view that illustrates an interconnect showing extrusion damage.

The doping process used to inject sulfur or selenium atoms into barrier layer 210 involves the use of a reactive gas or plasma that can also react with copper. Accordingly, in the absence of second conductive layer 208 protecting the underlying copper (e.g., first conductive layer 206), the copper will react with the sulfur or selenium and extrude outwards forming an extruded structure 214 as illustrated in FIG. 2B. The extruded structure 214 includes copper and sulfur (or selenium) and exhibits a lower conductivity compared to copper alone. Furthermore, extruded structure 214 could cause structural damage to the interconnect. Thus, the use of second conductive layer 208 prevents the formation of extruded structure 214, according to an embodiment.

As noted above, some embodiments use a different conductive material (e.g., different from copper) as conductive via 201. For example, ruthenium, tungsten, cobalt, or molybdenum may be used to form conductive via 201 as these materials do not react with sulfur or selenium to form extruded structures, such as extruded structure 214. It should be noted that only one conductive via 201 is illustrated, but that any number of conductive vias across any number of interconnect layers may include any of the via structures described herein.

Fabrication Methodology

FIGS. 3A-3G are cross-sectional views that collectively illustrate an example process for forming a portion of an interconnect region of an integrated circuit, in accordance with an embodiment of the present disclosure. Each figure shows an example structure that results from the process flow up to that point in time, so the depicted structure evolves as the process flow continues, culminating in the structure shown in FIG. 3G, which is similar to the structure illustrated in FIG. 2A. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 3A:
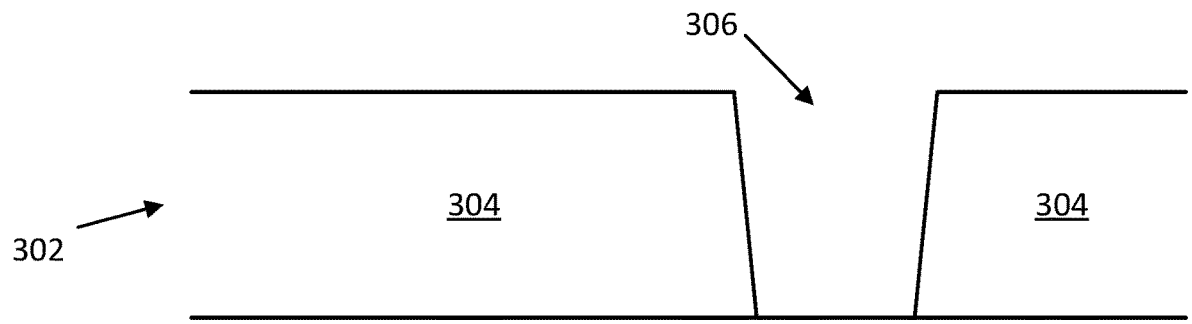
FIGS. 3A-3G are cross-sectional views that collectively illustrate an example process for forming an interconnect having a conductive via that is protected from subsequent exposure to reactive gas or plasma, in accordance with an embodiment of the present disclosure.

FIG. 3A is a cross sectional view taken through one of the interconnect layers of a plurality of stacked interconnect layers. Accordingly, interconnect layer 302 may be at any position within interconnect region 103. Interconnect layer 302 includes a dielectric layer 304 that may be any dielectric material, such as silicon oxide, silicon oxynitride, silicon nitride, or silicon oxycarbide. Dielectric layer 304 may be deposited using any known dielectric deposition technique, such as CVD, PECVD, flowable CVD, spin-on dielectric, or ALD. Dielectric layer 304 may have a height between about 15 nm and about 30 nm.

According to some embodiments, a via opening 306 is formed through dielectric layer 304. Via opening 306 may be formed using any anisotropic etching technique, such as using reactive ion etching (RIE) while masking the unetched regions of dielectric layer 304 with either a photoresist or hard mask. In some embodiments, via opening 306 exposes a conductive feature (e.g., conductive trace or conductive via) within an underling interconnect layer. The size of via opening 306 may be determined by design rules based on the size of the semiconductor devices of the integrated circuit, but in some examples, via opening 306 has a top (e.g. widest) diameter between about 5 nm and about 50 nm, between about 50 nm and about 100 nm, between about 100 nm and about 500 nm, or between about 500 nm and about 1000 nm.

Figure 3B:
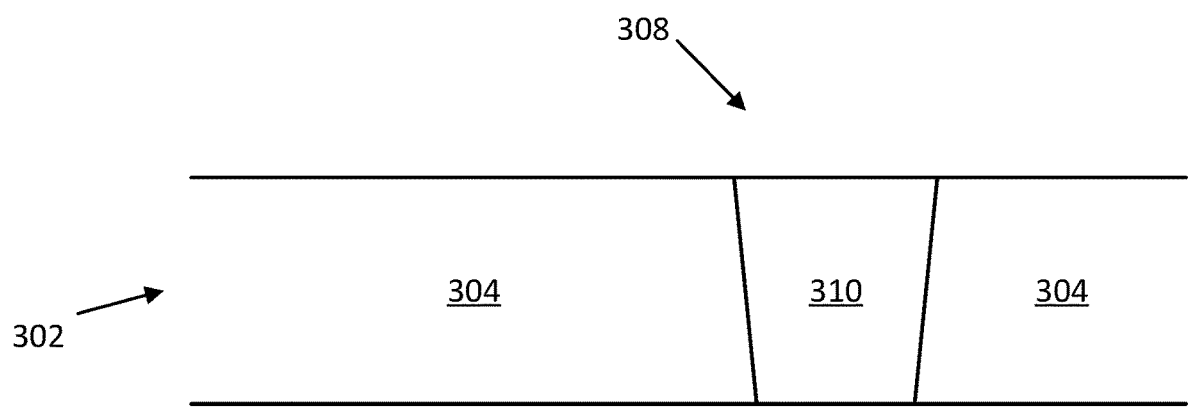

FIG. 3B is a cross sectional view of the structure depicted in FIG. 3A, after formation of conductive via 308, according to an embodiment of the present disclosure. Conductive via 308 may be formed within via opening 306 by depositing a conductive layer 310. According to some embodiments, conductive layer 310 is copper that is deposited using any one of electroplating, electroless plating, CVD, or PECVD, to name a few examples. After deposition of conductive layer 310, a polishing process may be performed using, for example, chemical mechanical polishing (CMP) to planarize a top surface of both conductive via 308 and dielectric layer 304. In some embodiments, a thin barrier layer is deposited along the inner surfaces of via opening 306 prior to the formation of conductive layer 310. The thin barrier layer may include tantalum.

According to some embodiments, other metal materials are used to form conductive via 308. For example, conductive layer 310 may be any of rubidium, cobalt, tungsten, or molybdenum, deposited using any of the same techniques discussed above. In the examples where copper is not used for conductive layer 310, the process described below with reference to FIG. 3C is not used and the fabrication proceeds as shown in FIGS. 3D-3G using a conductive via that includes any of rubidium, cobalt, tungsten, or molybdenum without any copper.

Figure 3C:
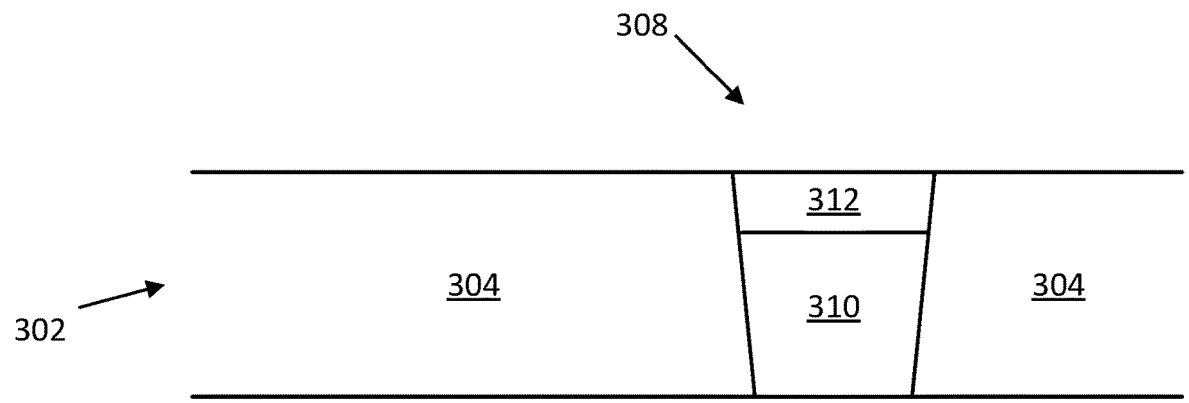

FIG. 3C is a cross sectional view of the structure depicted in FIG. 3B, after formation of another conductive layer 312 over conductive layer 310 in conductive via 308, according to an embodiment of the present disclosure. Conductive layer 310 may be recessed using any wet or dry isotropic metal etching technique. Following the recessing of conductive layer 310, conductive layer 312 may be deposited using any one of electroplating, electroless plating, CVD, or PECVD, to name a few examples. Following deposition of conductive layer 312, a polishing process may be performed using, for example, CMP to planarize a top surface of both conductive via 308 and dielectric layer 304.

According to some embodiments, conductive layer 310 includes copper and conductive layer 312 acts as a capping layer to protect the copper from the effects of later processes. In some embodiments, conductive layer 312 includes rubidium. In some other embodiments, conductive layer 312 includes any of cobalt, tungsten, or molybdenum. Conductive layer 312 may have a thickness between about 0.5 nm and about 2 nm.

Figure 3D:
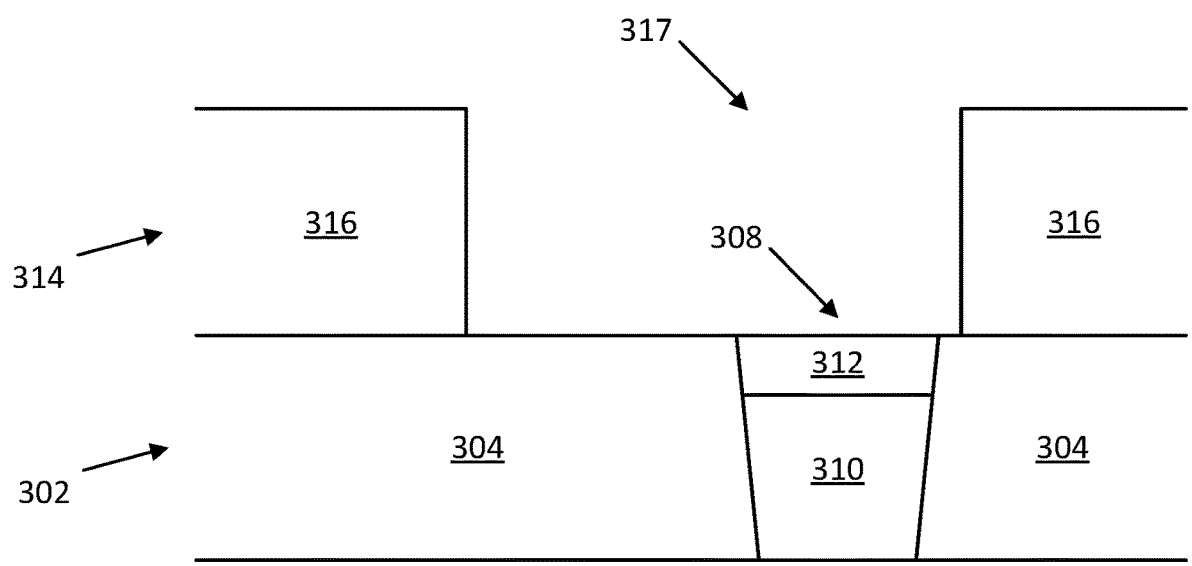

FIG. 3D is a cross sectional view of the structure depicted in FIG. 3C, after formation of a second interconnect layer 314, according to an embodiment of the present disclosure. Second interconnect layer 314 includes a dielectric layer 316 that may be any dielectric material, such as silicon oxide, silicon oxynitride, silicon nitride, or silicon oxycarbide. Dielectric layer 316 may be deposited using any known dielectric deposition technique, such as CVD, PECVD, flowable CVD, spin-on dielectric, or ALD. Dielectric layer 316 may have a height between about 15 nm and about 30 nm.

According to some embodiments, a cavity 317 is formed through dielectric layer 316. Cavity 317 may be formed using any anisotropic etching technique, such as RIE while masking the unetched regions of dielectric layer 316 with either a photoresist or hard mask. In some embodiments, the etching of cavity 317 continues until at least the top surface of conductive via 308 has been exposed. In some examples, cavity 317 defines the location of a conductive trace.

Figure 3E:
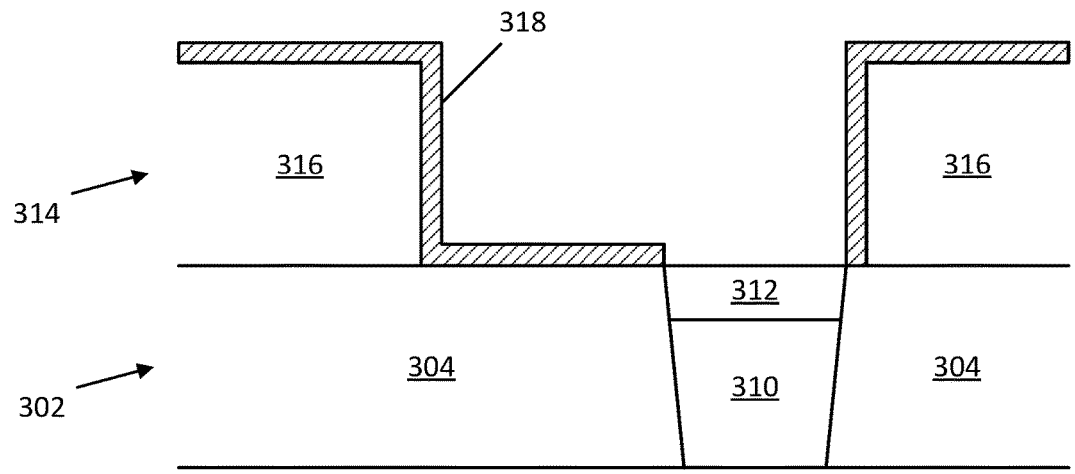

FIG. 3E is a cross sectional view of the structure depicted in FIG. 3D, after formation of a barrier layer 318, according to an embodiment of the present disclosure. Barrier layer 318 may be deposited using any one of CVD, PECVD, ALD, or physical vapor deposition (PVD). As noted above, barrier layer 318 may include tantalum and other elements such as nitrogen and oxygen (e.g., TaNO). Barrier layer 318 may be deposited to a thickness of less than 2.5 nm. In some examples, barrier layer 318 is between about 0.5 nm and about 1.5 nm or between about 1.0 nm and about 2.0 nm.

Barrier layer 318 may be deposited only over dielectric surfaces (such as the sidewalls and top surface of dielectric layer 316 and top surface of dielectric layer 304, as illustrated). In some other examples, barrier layer 318 is also deposited over the top surface of conductive layer 312.

Figure 3F:
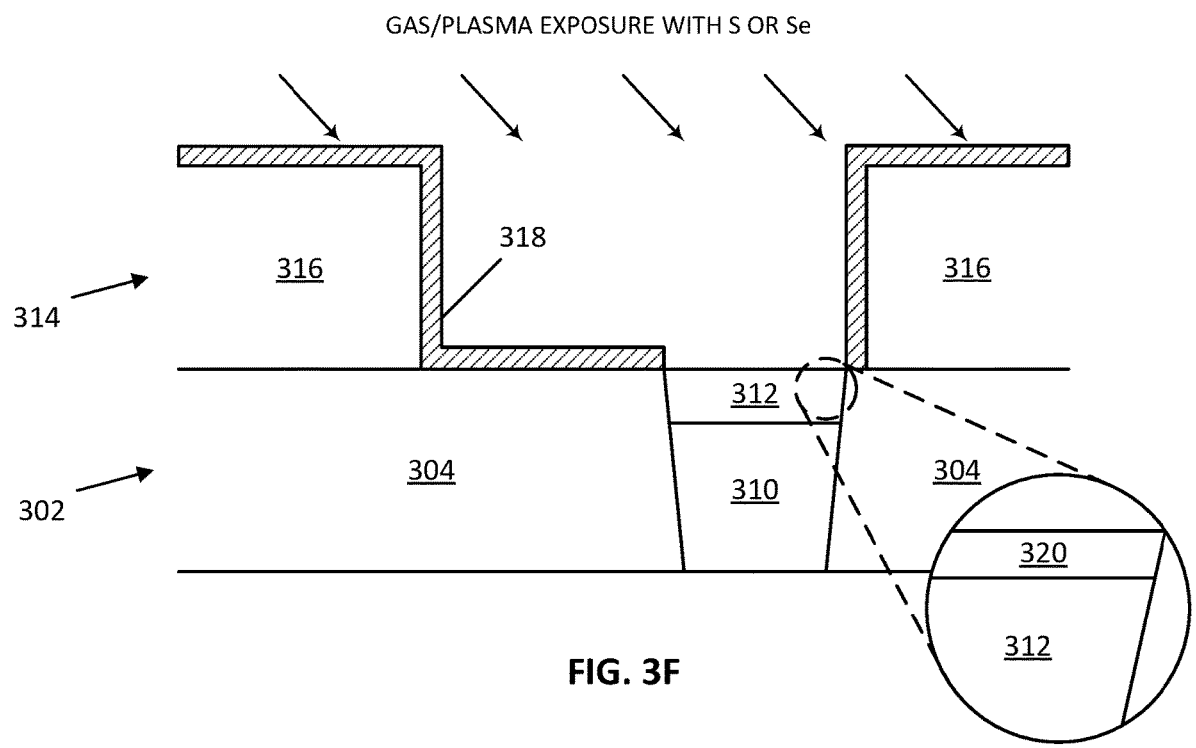

FIG. 3F is a cross sectional view of the structure depicted in FIG. 3E, after introduction of a reactive gas or plasma species, according to an embodiment of the present disclosure. Barrier layer 318 may be exposed to a gas or plasma environment that contains a chalcogen element, such as sulfur or selenium. The sulfur or selenium atoms diffuse into grain boundaries and/or lattice imperfections within barrier layer 318 to dope the material and form a barrier layer 318 of TaNOS or TaNOSe, to name a few examples. According to some embodiments, the doping process is performed in a gaseous environment of $H_2S$ at 250 C for between 30 minutes and 60 minutes and at a pressure of around 10 Torr.

According to some embodiments, the sulfur or selenium atoms are unable to reach the copper of conductive layer 310 due to the presence of conductive layer 312. According to some embodiments, some portion of conductive layer 312 is converted into a compound containing sulfur or selenium due to the exposure with the reactive elements. For example, when conductive layer 312 includes tungsten, a converted layer 320 of tungsten sulfide ($WS_2$) is formed. In another example, when conductive layer 312 includes molybdenum, converted layer 320 includes molybdenum sulfide ($MoS_2$). Higher temperatures used during the doping process will convert more of the tungsten or molybdenum in conductive layer 312 into tungsten sulfide or molybdenum sulfide. According to some embodiments, conductive layer 312 may be made thicker (e.g., 2-3 nm thick) when including either tungsten or molybdenum to ensure that the entire thickness of conductive layer 312 does not convert into either $WS_2$ or $MoS_2$. According to some embodiments, a negligible amount of ruthenium is converted when exposed to sulfur or selenium.

Figure 3G:
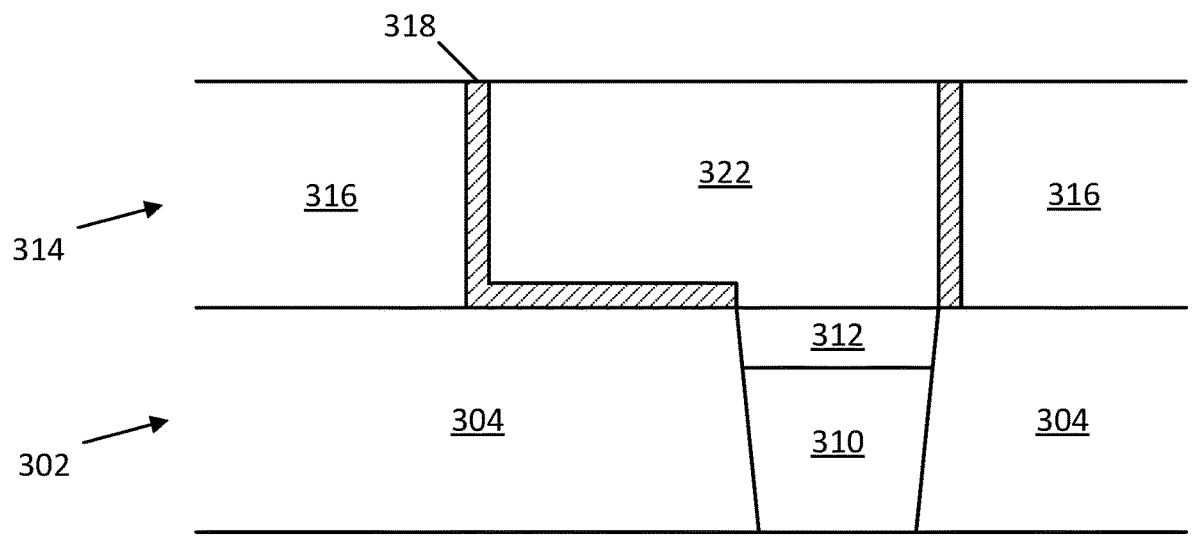

FIG. 3G is a cross sectional view of the structure depicted in FIG. 3F, after formation of conductive layer 322 within cavity 317, according to an embodiment of the present disclosure. One or more side and bottom surfaces of conductive layer 322 contact barrier layer 318. According to some embodiments, conductive layer 322 is copper that is deposited using any one of electroplating, electroless plating, CVD, or PECVD, to name a few examples. After deposition of conductive layer 322, a polishing process may be performed using, for example, CMP to planarize a top surface of both conductive layer 322 and dielectric layer 304. Note that the polishing process may also remove any portions of barrier layer 318 from the top surface of dielectric layer 316.

Figure 4:
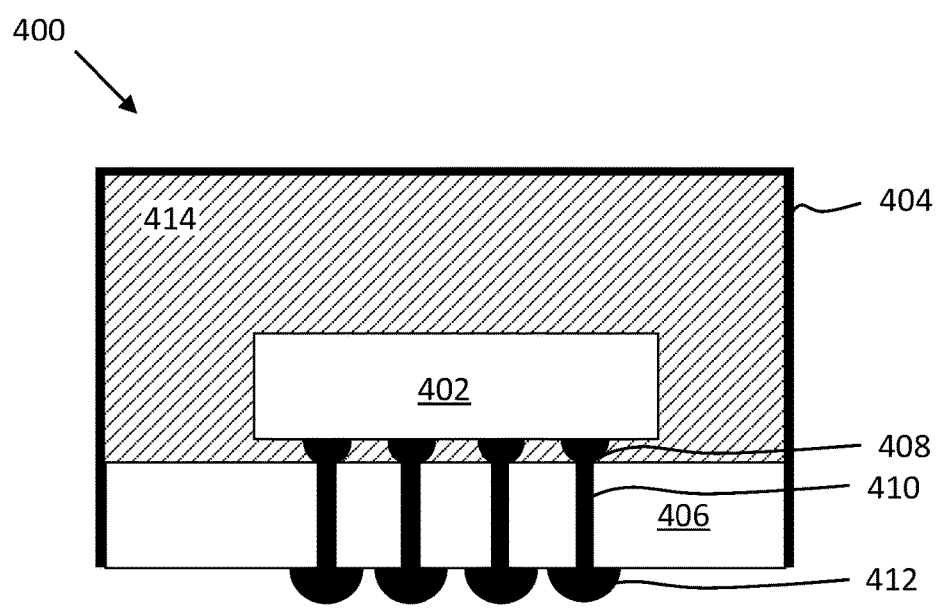
FIG. 4 illustrates a cross-section view of a chip package containing one or more semiconductor dies, in accordance with some embodiments of the present disclosure.

FIG. 4 illustrates an example embodiment of a chip package 400, in accordance with an embodiment of the present disclosure. As can be seen, chip package 400 includes one or more dies 402. One or more dies 402 may include at least one integrated circuit having a structure as described in any of the aforementioned embodiments. One or more dies 402 may include any other circuitry used to interface with other devices formed on the dies, or other devices connected to chip package 400, in some example configurations.

As can be further seen, chip package 400 includes a housing 404 that is bonded to a package substrate 406. The housing 404 may be any standard or proprietary housing, and may provide, for example, electromagnetic shielding and environmental protection for the components of chip package 400. The one or more dies 402 may be conductively coupled to a package substrate 406 using connections 408, which may be implemented with any number of standard or proprietary connection mechanisms, such as solder bumps, ball grid array (BGA), pins, or wire bonds, to name a few examples. Package substrate 406 may be any standard or proprietary package substrate, but in some cases includes a dielectric material having conductive pathways (e.g., including conductive vias and lines) extending through the dielectric material between the faces of package substrate 406, or between different locations on each face. In some embodiments, package substrate 406 may have a thickness less than 1 millimeter (e.g., between 0.1 millimeters and 0.5 millimeters), although any number of package geometries can be used. Additional conductive contacts 412 may be disposed at an opposite face of package substrate 406 for conductively contacting, for instance, a printed circuit board (PCB). One or more vias 410 extend through a thickness of package substrate 406 to provide conductive pathways between one or more of connections 408 to one or more of contacts 412. Vias 410 are illustrated as single straight columns through package substrate 406 for ease of illustration, although other configurations can be used (e.g., damascene, dual damascene, through-silicon via, or an interconnect structure that meanders through the thickness of substrate 406 to contact one or more intermediate locations therein). In still other embodiments, vias 410 are fabricated by multiple smaller stacked vias, or are staggered at different locations across package substrate 406. In the illustrated embodiment, contacts 412 are solder balls (e.g., for bump-based connections or a ball grid array arrangement), but any suitable package bonding mechanism may be used (e.g., pins in a pin grid array arrangement or lands in a land grid array arrangement).

In some embodiments, a solder resist is disposed between contacts 412, to inhibit shorting.

In some embodiments, a mold material 414 may be disposed around the one or more dies 402 included within housing 404 (e.g., between dies 402 and package substrate 406 as an underfill material, as well as between dies 402 and housing 404 as an overfill material). Although the dimensions and qualities of the mold material 414 can vary from one embodiment to the next, in some embodiments, a thickness of mold material 414 is less than 1 millimeter. Example materials that may be used for mold material 414 include epoxy mold materials, as suitable. In some cases, the mold material 414 is thermally conductive, in addition to being electrically insulating.

Methodology

Figure 5:
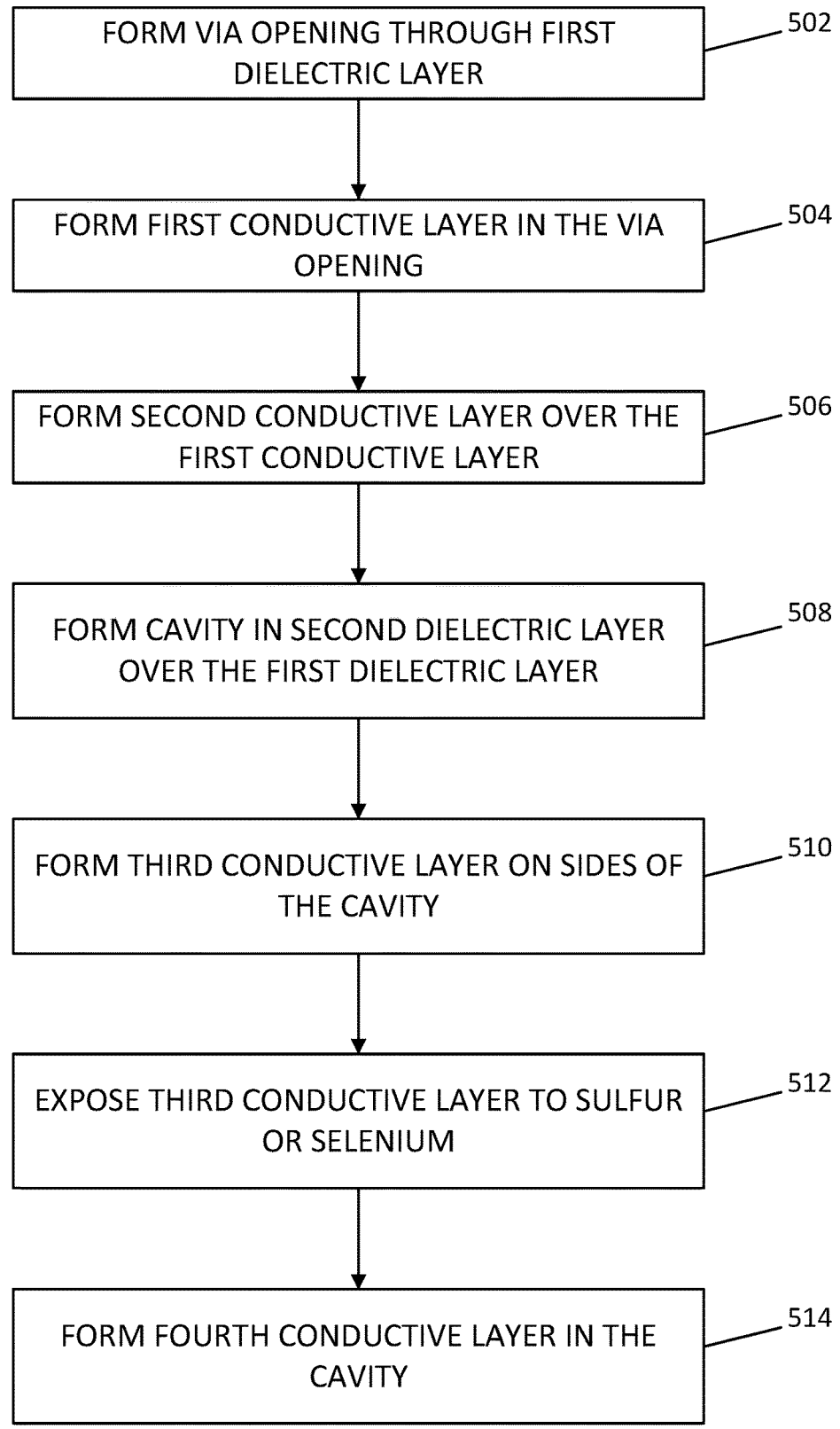
FIG. 5 is a flowchart of a fabrication process for an integrated circuit including an interconnect having a conductive via that is protected from subsequent exposure to reactive gas or plasma, in accordance with an embodiment of the present disclosure.

FIG. 5 is a flow chart of a method 500 for forming at least a portion of an integrated circuit, according to an embodiment. Various operations of method 500 may be illustrated in FIGS. 3A-3G. However, the correlation of the various operations of method 500 to the specific components illustrated in the aforementioned figures is not intended to imply any structural and/or use limitations. Rather, the aforementioned figures provide one example embodiment of method 500. Other operations may be performed before, during, or after any of the operations of method 500. For example, method 500 does not explicitly describe many steps that are performed to form common transistor structures. Some of the operations of method 500 may be performed in a different order than the illustrated order. In some embodiments, the various operations of method 500 are performed during back end-of-the-line (BEOL) processing.

Method 500 begins with operation 502 where a via opening is formed through a first dielectric layer. The first dielectric layer may be part of an interconnect layer within a plurality of stacked interconnect layers above a plurality of semiconductor devices. The first dielectric layer may be any dielectric material, such as silicon oxide, silicon oxynitride, silicon nitride, or silicon oxycarbide, may be deposited using any known dielectric deposition technique, such as CVD, PECVD, flowable CVD, spin-on dielectric, or ALD. The via opening may be formed using an anisotropic etching technique, such as RIE.

Method 500 continues with operation 504 where a first conductive layer is formed within the via opening. The first conductive layer may include copper that is deposited using any one of electroplating, electroless plating, CVD, or PECVD, to name a few examples. After deposition of the first conductive layer, a polishing process may be performed using, for example, CMP to planarize a top surface of both the first conductive layer and the first dielectric layer. In some embodiments, a thin barrier layer is deposited along the inner surfaces of the via opening prior to the formation of the first conductive layer. Following the polishing operation, the first conductive layer can be recessed within the via opening to reduce a thickness of the first conductive layer in the via opening. The recessing may be performed using any isotropic wet or dry metal etching process. In some embodiments, the first conductive layer is recessed by between about 0.5 nm and about 2 nm.

Method 500 continues with operation 506 where a second conductive layer is formed over the first conductive layer, at least partially within the via opening. The second conductive layer may be deposited using any one of electroplating, electroless plating, CVD, or PECVD, to name a few examples. Following deposition of the second conductive layer, another polishing process may be performed using, for example, CMP to planarize a top surface of both the second conductive layer and the first dielectric layer.

According to some embodiments, the first conductive layer includes copper and the second conductive layer acts as a capping layer to protect the copper from the effects of later processes. In some embodiments, the second conductive layer includes rubidium. In some other embodiments, the second conductive layer includes any of cobalt, tungsten, or molybdenum. The second conductive layer may have a thickness between about 0.5 nm and about 2 nm.

Method 500 continues with operation 508 where a cavity is formed within a second dielectric layer over the first dielectric layer. The second dielectric layer may include any of silicon oxide, silicon oxynitride, silicon nitride, or silicon oxycarbide, and may be deposited over the first dielectric layer using any known dielectric deposition technique, such as CVD, PECVD, flowable CVD, spin-on dielectric, or ALD.

The cavity may be formed using any anisotropic etching technique, such as RIE while masking the unetched regions of the second dielectric layer with either a photoresist or hard mask. In some embodiments, the etching of the cavity continues until at least the top surface of the second conductive layer within the via has been exposed.

Method 500 continues with operation 510 where a third conductive layer is formed on the sides of the cavity. According to some embodiments, the third conductive layer is formed on sidewalls of the cavity and a bottom surface of the cavity (e.g., a top surface of the first dielectric layer). The third conductive layer may be deposited using any one of CVD, PECVD, ALD, or PVD and acts as a barrier layer between the dielectric materials and conductive interconnect features. The third conductive layer may include tantalum and other elements such as nitrogen and oxygen (e.g., TaNO). The third conductive layer may be deposited to a thickness of less than 2.5 nm. In some examples, the third conductive layer is between about 0.5 nm and about 1.5 nm or between about 1.0 nm and about 2.0 nm.

Method 500 continues with operation 512 where the third conductive layer is exposed to a gas or plasma that contains a chalcogen element, such as sulfur or selenium. The sulfur or selenium atoms diffuse into grain boundaries and/or lattice imperfections within the third conductive layer to dope the material with either sulfur or selenium, according to some embodiments. Thus, the resulting third conductive layer may be TaNOS or TaNOSe, to name a few examples. According to some embodiments, the doping process is performed in a gaseous environment of $H_2S$ at 250 C for between 30 minutes and 60 minutes and at a pressure of around 10 Torr.

The second conductive layer within the via is also exposed to the gas or plasma that contains the chalcogen element. However, the second conductive layer blocks the reactive chalcogen element from interacting with the first conductive layer (e.g., copper).

Method 500 continues with operation 514 where a fourth conductive layer is formed within the cavity. One or more side and bottom surfaces of the fourth conductive layer contacts the third conductive layer. According to some embodiments, the fourth conductive layer is copper that is deposited using any one of electroplating, electroless plating, CVD, or PECVD, to name a few examples. After deposition of the fourth conductive layer, a polishing process may be performed using, for example, CMP to planarize a top surface of both the fourth conductive layer and the second dielectric layer.

Example System

Figure 6:
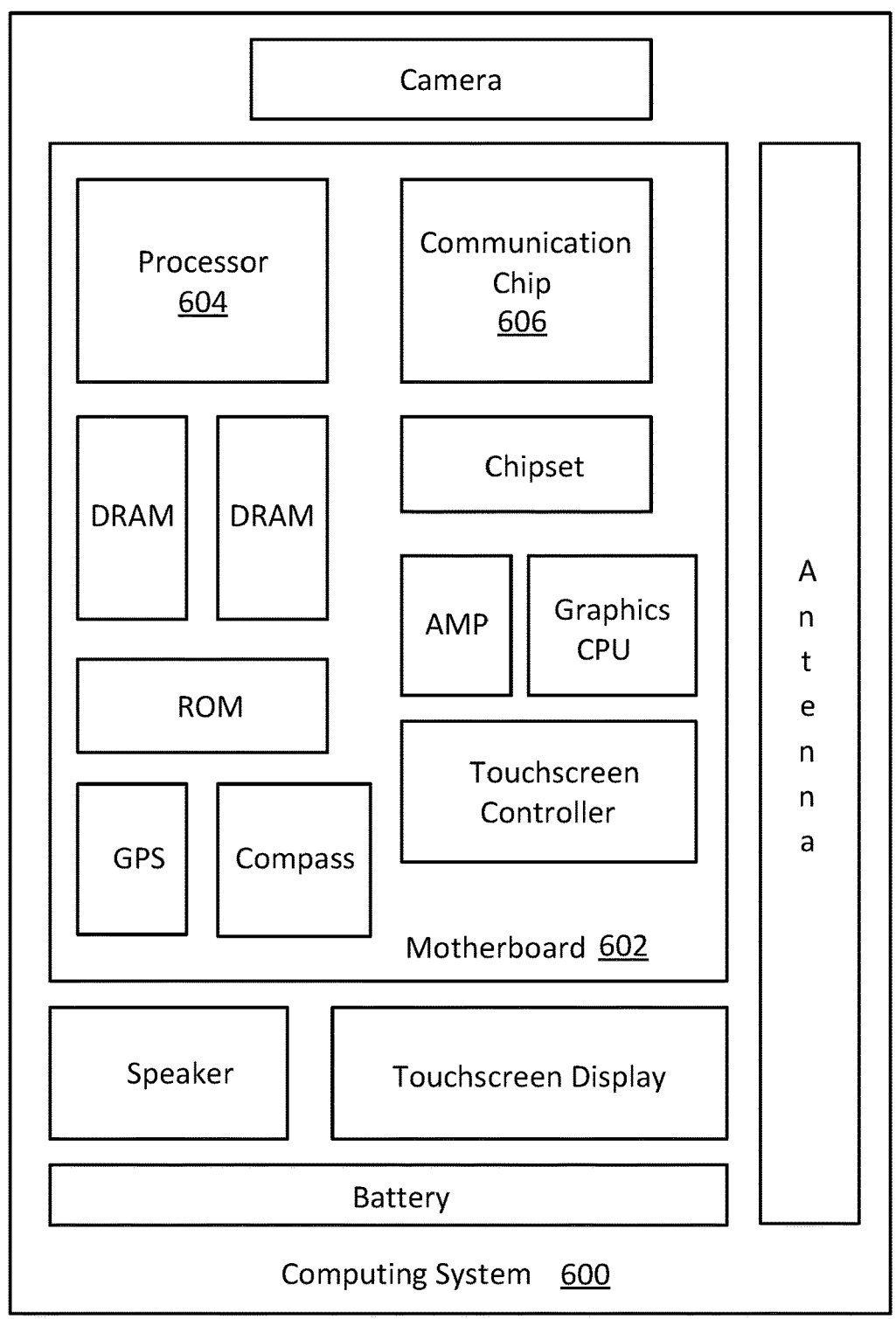
FIG. 6 illustrates a computing system including one or more integrated circuits, as variously described herein, in accordance with an embodiment of the present disclosure.

FIG. 6 is an example computing system implemented with one or more of the integrated circuit structures as disclosed herein, in accordance with some embodiments of the present disclosure. As can be seen, the computing system 600 houses a motherboard 602. The motherboard 602 may include a number of components, including, but not limited to, a processor 604 and at least one communication chip 606, each of which can be physically and electrically coupled to the motherboard 602, or otherwise integrated therein. As will be appreciated, the motherboard 602 may be, for example, any printed circuit board (PCB), whether a main board, a daughterboard mounted on a main board, or the only board of system 600, etc.

Depending on its applications, computing system 600 may include one or more other components that may or may not be physically and electrically coupled to the motherboard 602. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 600 may include one or more integrated circuit structures or devices configured in accordance with an example embodiment (e.g., a module including an integrated circuit having interconnect structures that use material such as ruthenium, cobalt, tungsten, or molybdenum within one or more of the conductive vias). In some embodiments, multiple functions can be integrated into one or more chips (e.g., for instance, note that the communication chip 606 can be part of or otherwise integrated into the processor 604).

The communication chip 606 enables wireless communications for the transfer of data to and from the computing system 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing system 600 includes an integrated circuit die packaged within the processor 604. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 606 also may include an integrated circuit die packaged within the communication chip 606. In accordance with some such example embodiments, the integrated circuit die of the communication chip includes one or more semiconductor devices as variously described herein. As will be appreciated in light of this disclosure, note that multi-standard wireless capability may be integrated directly into the processor 604 (e.g., where functionality of any chips 606 is integrated into processor 604, rather than having separate communication chips). Further note that processor 604 may be a chip set having such wireless capability. In short, any number of processor 604 and/or communication chips 606 can be used. Likewise, any one chip or chip set can have multiple functions integrated therein.

In various implementations, the computing system 600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 600 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a first interconnect layer above a plurality of semiconductor devices and a second interconnect layer over the first interconnect layer. The first interconnect layer includes a first dielectric layer and a conductive via through the first dielectric layer. The conductive via has a first conductive layer. The second interconnect layer includes a second dielectric layer, a second conductive layer at least partially within the second dielectric layer, and a third conductive layer between the second conductive layer and the second dielectric layer. The third conductive layer comprises oxygen and one or both of sulfur and selenium, and the second conductive layer comprises a different metal than the first conductive layer.

Example 2 includes the subject matter of Example 1, wherein a top surface of the first conductive layer of the conductive via is in direct contact with the second conductive layer of the second interconnect layer.

Example 3 includes the subject matter of Example 1 or 2, wherein the first conductive layer comprises ruthenium.

Example 4 includes the subject matter of Example 1 or 2, wherein the first conductive layer comprises cobalt, tungsten, or molybdenum.

Example 5 includes the subject matter of any one of Examples 1-4, wherein the conductive via comprises a fourth conductive layer beneath the first conductive layer.

Example 6 includes the subject matter of Example 5, wherein the fourth conductive layer comprises copper and the first conductive layer comprises ruthenium.

Example 7 includes the subject matter of Example 5, wherein the fourth conductive layer comprises copper and the first conductive layer comprises cobalt, tungsten, or molybdenum.

Example 8 includes the subject matter of Example 7, wherein a top portion of the first conductive layer comprises molybdenum and one or both of sulfur and selenium.

Example 9 includes the subject matter of any one of Examples 5-8, wherein the first conductive layer has a thickness between about 5 angstroms and about 20 angstroms.

Example 10 includes the subject matter of any one of Examples 5-9, wherein the third conductive layer is present on a top surface of the first conductive layer.

Example 11 includes the subject matter of any one of Examples 1-10, wherein the third conductive layer has a thickness of 20 angstroms or less.

Example 12 includes the subject matter of Example 11, wherein the third conductive layer has a thickness between 5 angstroms and 15 angstroms.

Example 13 includes the subject matter of any one of Examples 1-12, wherein the third conductive layer is present on a top surface of the first conductive layer.

Example 14 is a printed circuit board comprising the integrated circuit of any one of Examples 1-13.

Example 15 is an integrated circuit, comprising: a device layer including a plurality of semiconductor devices; a first interconnect layer above the device layer and comprising a first dielectric layer and a conductive via through the first dielectric layer, the conductive via including a first conductive layer on a second conductive layer, the first conductive layer comprising a first metal, and the second conductive layer comprising a second metal compositionally different from the first metal; and a second interconnect layer over the first interconnect layer and having a second dielectric layer, a third conductive layer at least partially within the second dielectric layer, and a fourth conductive layer between the third conductive layer and the second dielectric layer, the third conductive layer comprising the second metal.

Example 16 includes the subject matter of Example 15, wherein the fourth conductive layer comprises oxygen and either sulfur or selenium.

Example 17 includes the subject matter of Example 15 or 16, wherein the first metal is ruthenium, and the second metal is copper.

Example 18 includes the subject matter of any one of Examples 15-17, wherein the fourth conductive layer has a thickness of about 20 angstroms or less.

Example 19 includes the subject matter of Example 18, wherein the fourth conductive layer has a thickness between about 9 angstroms and about 19 angstroms.

Example 20 includes the subject matter of Example 18 or 19, wherein the fourth conductive layer has a thickness between about 5 angstroms and about 15 angstroms.

Example 20 includes the subject matter of any one of Examples 15-19, wherein the first conductive layer has a thickness between about 5 angstroms and about 20 angstroms.

Example 21 includes the subject matter of any one of Examples 15-20, wherein the fourth conductive layer is present on a top surface of the first conductive layer.

Example 22 is a printed circuit board comprising the integrated circuit of any one of Examples 15-21.

Example 23 is an electronic device that includes a chip package comprising one or more dies. At least one of the one or more dies includes a plurality of semiconductor devices, a first interconnect layer, and a second interconnect layer over the first interconnect layer. The first interconnect layer includes a first dielectric layer and a conductive via through the first dielectric layer. The conductive via has a first conductive layer. The second interconnect layer includes a second dielectric layer, a second conductive layer at least partially within the second dielectric layer, and a third conductive layer between the second conductive layer and the second dielectric layer. The third conductive layer comprises oxygen and one or both of sulfur and selenium, and the second conductive layer comprises a different metal than the first conductive layer.

Example 24 includes the subject matter of Example 23, wherein a top surface of the first conductive layer of the conductive via is in direct contact with the second conductive layer of the second interconnect layer.

Example 25 includes the subject matter of Example 23 or 24, wherein the first conductive layer comprises ruthenium.

Example 26 includes the subject matter of Example 23 or 24, wherein the first conductive layer comprises cobalt, tungsten, or molybdenum.

Example 27 includes the subject matter of any one of Examples 23-26, wherein the conductive via comprises a fourth conductive layer beneath the first conductive layer.

Example 28 includes the subject matter of Example 27, wherein the fourth conductive layer comprises copper and the first conductive layer comprises ruthenium.

Example 29 includes the subject matter of Example 27, wherein the fourth conductive layer comprises copper and the first conductive layer comprises cobalt, tungsten, or molybdenum.

Example 30 includes the subject matter of Example 29, wherein a top portion of the first conductive layer comprises molybdenum and one or both of sulfur and selenium.

Example 31 includes the subject matter of any one of Examples 27-30, wherein the first conductive layer has a thickness between about 5 angstroms and about 20 angstroms.

Example 32 includes the subject matter of any one of Examples 27-31, wherein the third conductive layer is present on a top surface of the first conductive layer.

Example 33 includes the subject matter of any one of Examples 23-32, wherein the third conductive layer has a thickness of 20 angstroms or less.

Example 34 includes the subject matter of Example 33, wherein the third conductive layer has a thickness between 5 angstroms and 15 angstroms.

Example 35 includes the subject matter of any one of Examples 23-34, wherein the third conductive layer is present on a top surface of the first conductive layer.

Example 36 includes the subject matter of any one of Examples 23-35, further comprising a printed circuit board, wherein the chip package is attached to the printed circuit board.

Example 37 is a method of forming an integrated circuit. The method includes forming a first interconnect layer above a plurality of semiconductor devices and forming a second interconnect layer over the first interconnect layer. Forming the first interconnect layer includes forming a first dielectric layer, forming a via through the first dielectric layer, forming a first conductive layer in the via, and forming a second conductive layer in the via over the first conductive layer. Forming the second interconnect layer includes forming a second dielectric layer, forming a cavity in the second dielectric layer over the via, forming a third conductive layer on one or more sidewalls of the cavity, the third conductive layer comprising oxygen, exposing the third conductive layer to a gas comprising sulfur or selenium to dope the third conductive layer with either sulfur or selenium, and forming a fourth conductive layer in the cavity.

Example 38 includes the subject matter of Example 37, wherein the exposing comprises exposing the third conductive layer to the gas at a temperature between about 200 C and about 300 C.

Example 39 includes the subject matter of Example 37 or 38, wherein forming the third conductive layer comprises forming the third conductive layer having a thickness between about 10 angstroms and about 20 angstroms.

Example 40 includes the subject matter of any one of Examples 37-39, wherein the first conductive layer comprises copper and the second conductive layer comprises ruthenium.

Example 41 includes the subject matter of any one of Examples 37-39, wherein the first conductive layer comprises copper and the second conductive layer comprises cobalt, tungsten, or molybdenum.

Example 42 includes the subject matter of any one of Examples 37-41, wherein forming the third conductive layer comprises forming the third conductive layer on a top surface of the second conductive layer.

Example 43 includes the subject matter of any one of Examples 37-42, wherein forming the second conductive layer comprises forming the second conductive layer having a thickness between about 5 angstroms and about 20 angstroms.

Example 44 is an integrated circuit that includes a first interconnect layer above a plurality of semiconductor devices and a second interconnect layer over the first interconnect layer. The first interconnect layer comprises a first dielectric layer and a conductive via through the first dielectric layer. The conductive via has a first conductive layer and a second conductive layer below the first conductive layer. The second interconnect layer comprises a second dielectric layer, a third conductive layer at least partially within the second dielectric layer, and a fourth conductive layer between the third conductive layer and the second dielectric layer. The fourth conductive layer is less than about 20 angstroms thick.

Example 45 includes the subject matter of Example 44, wherein a top surface of the first conductive layer of the conductive via is in direct contact with the third conductive layer of the second interconnect layer.

Example 46 includes the subject matter of Example 44 or 45, wherein the first conductive layer comprises ruthenium, cobalt, tungsten, or molybdenum, and the second conductive layer comprises copper.

Example 47 includes the subject matter of Example 46, wherein a top portion of the first conductive layer comprises molybdenum and one or both of sulfur and selenium.

Example 48 includes the subject matter of any one of Examples 44-47, wherein the first conductive layer has a thickness between about 5 angstroms and about 20 angstroms.

Example 49 includes the subject matter of any one of Examples 44-48, wherein the fourth conductive layer comprises oxygen and one or both of sulfur and selenium.

Example 50 includes the subject matter of any one of Examples 44-49, wherein the fourth conductive layer has a thickness between about 10 angstroms and about 20 angstroms.

Example 51 is an integrated circuit that includes a first interconnect layer above a plurality of semiconductor devices and a second interconnect layer over the first interconnect layer. The first interconnect layer comprises a first dielectric layer and a conductive via through the first dielectric layer. The conductive via includes a first conductive layer. The second interconnect layer comprises a second dielectric layer, a second conductive layer at least partially within the second dielectric layer, and a third conductive layer between the second conductive layer and the second dielectric layer. The third conductive layer is less than about 20 angstroms thick and the second conductive layer comprises a different metal than the first conductive layer.

Example 52 includes the subject matter of Example 51, wherein the first conductive layer comprises ruthenium, cobalt, tungsten, or molybdenum.

Example 53 includes the subject matter of Example 51 or 52, wherein the conductive via comprises a fourth conductive layer beneath the first conductive layer.

Example 54 includes the subject matter of Example 53, wherein the fourth conductive layer comprises copper and the first conductive layer comprises ruthenium, cobalt, tungsten, or molybdenum.

Example 55 includes the subject matter of Example 53 or 54, wherein a top portion of the first conductive layer comprises molybdenum and either sulfur or selenium.

Example 56 includes the subject matter of any one of Examples 53-55, wherein the first conductive layer has a thickness between about 5 angstroms and about 20 angstroms.

Example 57 includes the subject matter of any one of Examples 51-56, wherein the third conductive layer comprises oxygen and one or both of sulfur and selenium.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit, comprising:
    a first interconnect layer above a plurality of semiconductor devices, the first interconnect layer comprising a first dielectric layer and a conductive via through the first dielectric layer, the conductive via having a first conductive layer and a second conductive layer below the first conductive layer; and
    a second interconnect layer over the first interconnect layer, the second interconnect layer comprising a second dielectric layer, a third conductive layer at least partially within the second dielectric layer, and a fourth conductive layer between the third conductive layer and the second dielectric layer, wherein the fourth conductive layer is less than about 20 angstroms thick and comprises one or both of sulfur and selenium.

2. The integrated circuit of claim 1, wherein a top surface of the first conductive layer of the conductive via is in direct contact with the third conductive layer of the second interconnect layer.

3. The integrated circuit of claim 1, wherein the first conductive layer comprises ruthenium, cobalt, tungsten, or molybdenum, and the second conductive layer comprises copper.

4. The integrated circuit of claim 3, wherein a top portion of the first conductive layer comprises molybdenum and one or both of sulfur and selenium.

5. The integrated circuit of claim 1, wherein the first conductive layer has a thickness between about 5 angstroms and about 20 angstroms.

6. The integrated circuit of claim 1, wherein the fourth conductive layer further comprises oxygen.

7. The integrated circuit of claim 1, wherein the fourth conductive layer has a thickness between about 10 angstroms and about 20 angstroms.

8. An integrated circuit, comprising:
a first interconnect layer above a plurality of semiconductor devices, the first interconnect layer comprising a first dielectric layer and a conductive via through the first dielectric layer, the conductive via having a first conductive layer; and
a second interconnect layer over the first interconnect layer, the second interconnect layer comprising a second dielectric layer, a second conductive layer at least partially within the second dielectric layer, and a third conductive layer between the second conductive layer and the second dielectric layer, wherein the third conductive layer is less than about 20 angstroms thick and comprises one or both of sulfur and selenium, wherein the second conductive layer comprises a different metal than the first conductive layer.

9. The integrated circuit of claim 8, wherein the first conductive layer comprises ruthenium, cobalt, tungsten, or molybdenum.

10. The integrated circuit of claim 8, wherein the conductive via comprises a fourth conductive layer beneath the first conductive layer.

11. The integrated circuit of claim 10, wherein the fourth conductive layer comprises copper and the first conductive layer comprises ruthenium, cobalt, tungsten, or molybdenum.

12. The integrated circuit of claim 10, wherein a top portion of the first conductive layer comprises molybdenum and either sulfur or selenium.

13. The integrated circuit of claim 10, wherein the first conductive layer has a thickness between about 5 angstroms and about 20 angstroms.

14. The integrated circuit of claim 8, wherein the third conductive layer further comprises oxygen.

15. An integrated circuit, comprising:
a device layer including a plurality of semiconductor devices;
a first interconnect layer above the device layer and comprising a first dielectric layer and a conductive via through the first dielectric layer, the conductive via including a first conductive layer on a second conductive layer, the first conductive layer comprising a first metal, and the second conductive layer comprising a second metal compositionally different from the first metal; and
a second interconnect layer over the first interconnect layer and having a second dielectric layer, a third conductive layer at least partially within the second dielectric layer, and a fourth conductive layer between the third conductive layer and the second dielectric layer and comprising one or both of sulfur and selenium, the third conductive layer comprising the second metal.

16. The integrated circuit of claim 15, wherein the fourth conductive layer further comprises oxygen.

17. The integrated circuit of claim 15, wherein the first metal is ruthenium, and the second metal is copper.

18. The integrated circuit of claim 15, wherein the fourth conductive layer has a thickness of about 20 angstroms or less.

19. The integrated circuit of claim 18, wherein the fourth conductive layer has a thickness between about 9 angstroms and about 19 angstroms.

20. The integrated circuit of claim 15, wherein the first conductive layer has a thickness between about 5 angstroms and about 20 angstroms.

* * * * *